United States Patent
Chiu et al.

(10) Patent No.: US 7,974,421 B2
(45) Date of Patent: Jul. 5, 2011

(54) AUDIO SIGNAL PROCESSING METHOD AND RELATED DEVICE

(75) Inventors: Chung-Ko Chiu, Tao-Yuan (TW); Hung-Chuan Wei, Tao-Yuan (TW); Che-Wei Liao, Tao-Yuan (TW); Po-Chang Ho, Tao-Yuan (TW)

(73) Assignee: HTC Corporation, Taoyuan, Taoyuan County (TW)

( * ) Notice: Subject to any disclaimer, the term of this patent is extended or adjusted under 35 U.S.C. 154(b) by 992 days.

(21) Appl. No.: 11/839,544

(22) Filed: Aug. 16, 2007

(65) Prior Publication Data

US 2008/0044039 A1 Feb. 21, 2008

(30) Foreign Application Priority Data

Aug. 17, 2006 (TW) .............................. 95130241 A (51) Int. Cl.
- *H03G 3/00* (2006.01)
- *G06F 17/00* (2006.01)
- *H04R 29/00* (2006.01)
- *H04B 1/16* (2006.01)
- *H04B 7/00* (2006.01)

(52) U.S. Cl. ......... 381/107; 381/56; 700/94; 455/232.1; 73/900

(58) Field of Classification Search .................. 700/94; 381/55, 56, 104, 107; 455/67.11, 219, 221, 455/232.1, 235.1, 239.1, 240.1, 355, 234.1; 708/672; 73/900

See application file for complete search history.

(56) References Cited

U.S. PATENT DOCUMENTS

| | | | |
|---|---|---|---|
| 5,130,665 A | 7/1992 | Walden | |
| 5,175,770 A | 12/1992 | Back | |
| 5,606,625 A * | 2/1997 | Dallavalle et al. | 381/107 |
| 5,659,582 A * | 8/1997 | Kojima et al. | 455/234.1 |
| 5,761,251 A * | 6/1998 | Wender | 455/219 |
| 5,963,652 A | 10/1999 | Tran et al. | |
| 6,088,583 A * | 7/2000 | Shimizu et al. | 455/235.1 |
| 6,544,122 B2 | 4/2003 | Araki et al. | |
| 7,088,834 B2 | 8/2006 | Takemoto et al. | |
| 2006/0098827 A1* | 5/2006 | Paddock et al. | 700/94 |

FOREIGN PATENT DOCUMENTS

| | | |
|---|---|---|
| TW | 00289477 | 10/1996 |
| TW | 00356538 | 4/1999 |
| TW | 00519617 | 2/2003 |
| TW | 00581964 | 4/2004 |
| TW | 00588540 | 5/2004 |
| TW | 00589910 | 6/2004 |
| TW | I240573 | 9/2005 |

* cited by examiner

*Primary Examiner* — Curtis Kuntz
*Assistant Examiner* — Jesse A Elbin
(74) *Attorney, Agent, or Firm* — Winston Hsu; Scott Margo (57) ABSTRACT

An audio signal processing method includes: controlling the volume of a digital audio signal according to a latest value of an adaptive gain value which is adjustable; detecting whether data carried by the digital audio signal satisfies a specific criterion and utilizing a pendulum counter to count a number of times the data carried by the digital audio signal satisfies the specific criterion; if the counter value of the pendulum counter reaches an upper bond, selectively decreasing the adaptive gain value according to a decrement to decrease the volume of the digital audio signal; and if the counter value of the pendulum counter reaches a lower bond, selectively increasing the adaptive gain value according to an increment to increase the volume of the digital audio signal, where the magnitude of the decrement and the magnitude of the increment are different from each other.

18 Claims, 5 Drawing Sheets

AUDIO SIGNAL PROCESSING METHOD AND RELATED DEVICE

BACKGROUND OF THE INVENTION

1. Field of the Invention

The present invention relates to volume control of digital audio signals, and more particularly, to audio signal processing methods capable of controlling the volume of a digital audio signal, and related devices.

2. Description of the Prior Art

Regarding a portable electronic device, the speaker installed therein is typically quite tiny so it can be contained in a compact shell of the portable electronic device. In addition, as the internal space of the compact shell may not contain too many components, and as the overall material cost of the portable electronic device should be controlled according to a budget in a design phase, the calculation capability of the portable electronic device is typically quite limited.

Taking a cellular phone as an example, driving a tiny speaker within the cellular phone to output an acceptable volume is quite workable. As the magnitude of audio signals vary in accordance with the content of the media to be played back (e.g. audio media or video media), and as the magnitude of an audio signal generated while playing back the same medium may also vary in accordance with different portions of the content of the medium, volume control has become a necessary mechanism within this kind of portable electronic device, to prevent this tiny speaker from being burned out due to an excessive audio signal. However, the conventional volume control mechanism typically over-uses or over-relies on the calculation capability of the portable electronic device, or requires too many additional components that make the circuitries of the portable electronic devices too complex.

Figure 1:
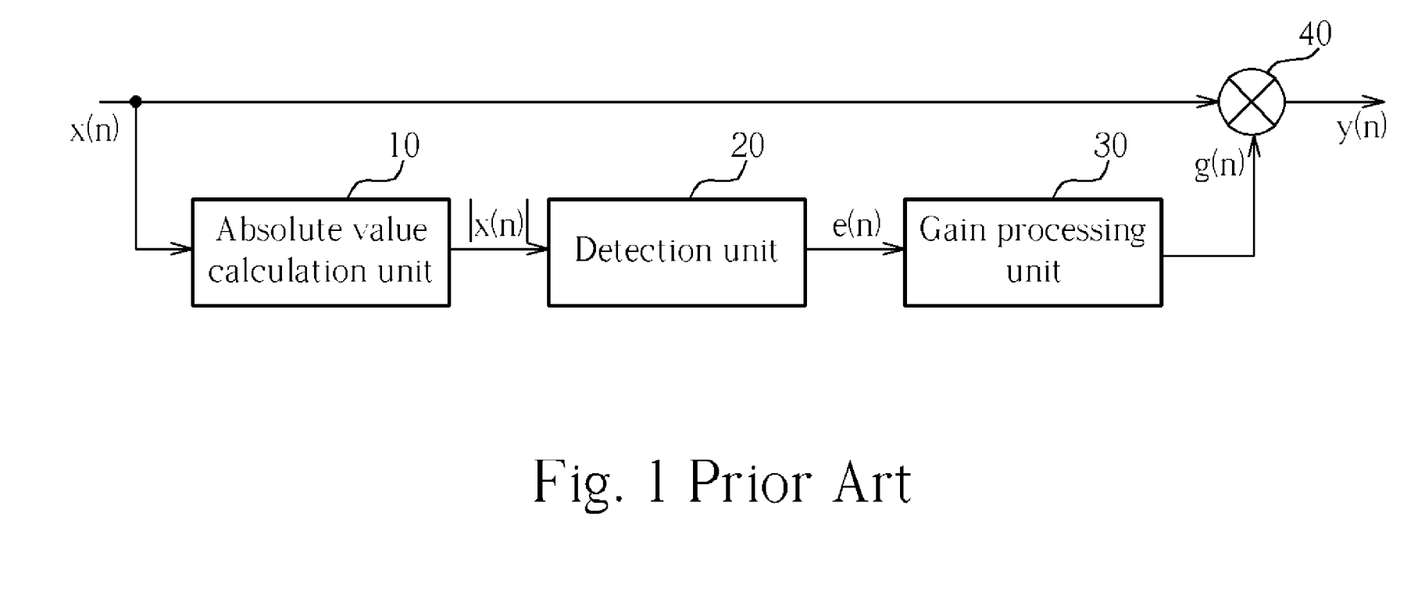
FIG. 1 is a diagram of a volume control circuit according to the prior art.

Please refer to FIG. 1. A volume control circuit according to the prior art as shown in FIG. 1 comprises an absolute value calculation unit 10, a detection unit 20, a gain processing unit 30, and a multiplier 40. The absolute value calculation unit 10 is utilized for calculating an absolute value |x(n)| of an audio sample x(n) carried by a digital audio signal, and the detection unit 20 performs volume detection according to the absolute value |x(n)| to generate a detection result e(n). In addition, the gain processing unit 30 controls a gain value g(n) according to the detection result e(n), so the multiplier 40 multiplies the audio sample x(n) by the gain value g(n) to generate the volume-adjusted audio sample y(n). The volume control circuit shown in FIG. 1 belongs to a sample-based volume control mechanism, so problems such as sample related distortions may easily occur.

As mentioned, the conventional volume control mechanism for the portable electronic devices according to the prior art is typically too complex or typically over-uses the calculation capability of the portable electronic devices, and problems such as sample related distortions may often occur.

SUMMARY OF THE INVENTION

It is therefore an objective of the claimed invention to provide audio signal processing methods and related devices to solve the above-mentioned problem.

It is another objective of the claimed invention to provide audio signal processing methods and related devices, in order to automatically optimize the volume of a digital audio signal, so burning out of a speaker within an output module can be prevented.

It is another objective of the claimed invention to provide audio signal processing methods and related devices, in order to dynamically satisfy various volume requirements while playing back a medium (e.g. an audio medium or an video medium), and further satisfy various respective volume requirements for playing back different media.

According to one embodiment of the claimed invention, an audio signal processing method is disclosed. The audio signal processing method comprises: controlling the volume of a digital audio signal according to the latest value of an adaptive gain value which is adjustable; detecting whether data carried by the digital audio signal satisfies a specific criterion and utilizing a pendulum counter to count a number of times the data carried by the digital audio signal satisfies the specific criterion; if the counter value of the pendulum counter reaches an upper bond, selectively decreasing the adaptive gain value according to a decrement to decrease the volume of the digital audio signal; and if the counter value of the pendulum counter reaches a lower bond, selectively increasing the adaptive gain value according to an increment to increase the volume of the digital audio signal, wherein the magnitude of the decrement and the magnitude of the increment are different from each other.

While providing the audio signal processing method mentioned above, the claimed invention further provides an audio signal processing device. The audio signal processing device comprises: a decoder for decoding a bit stream to generate a digital audio signal; and an audio signal processing unit, coupled to the decoder, for controlling the volume of the digital audio signal according to the audio signal processing method.

While providing the audio signal processing method mentioned above, the claimed invention further provides an audio playback device. The audio playback device comprises: a storage module for storing audio information, and outputting a bit stream corresponding to the audio information while the audio information is read; a decoder, coupled to the storage module, for decoding the bit stream to generate a digital audio signal; an audio signal processing unit, coupled to the decoder, for controlling the volume of the digital audio signal according to the audio signal processing method to generate a digital output signal corresponding to the digital audio signal; a digital-to-analog converter (DAC), coupled to the audio signal processing unit, for performing digital-to-analog conversion on the digital output signal to generate an analog output signal; and an output module for outputting the analog output signal representing the audio information.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
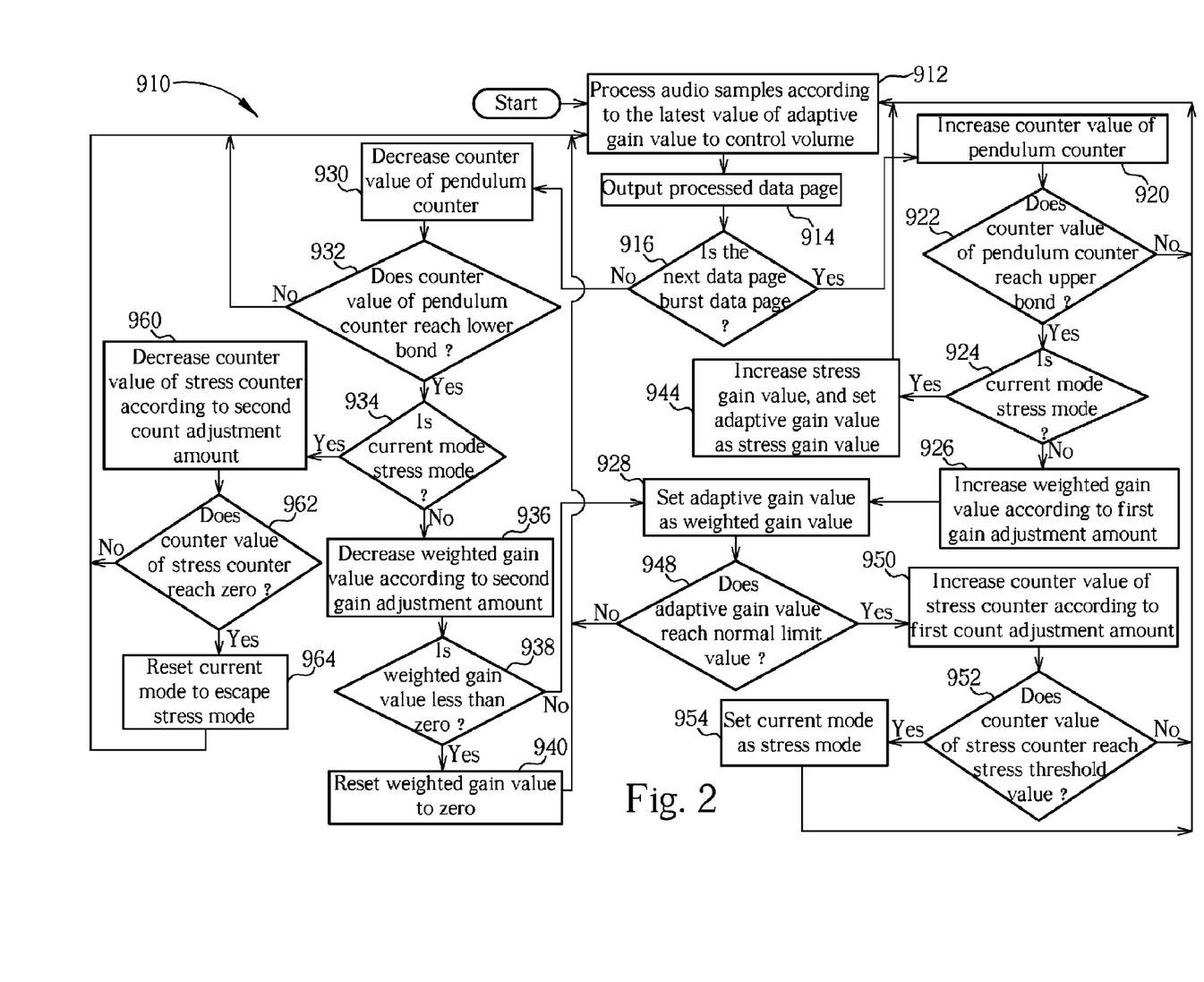
FIG. 2 is a flowchart of an audio signal processing method according to one embodiment of the present invention.

Please refer to FIG. 2. FIG. 2 is a flowchart of an audio signal processing method 910 according to a first embodiment of the present invention, where the audio signal processing method 910 is utilized for controlling the volume of a digital audio signal. The audio signal processing method 910 is capable of automatically optimizing the volume of the digital audio signal, and is capable of further preventing a speaker within an output module from being burned out while playing back the content of the digital audio signal.

In Step 912, processing of audio samples carried by the digital audio signal occurs according to the latest value of an adaptive gain value to control the volume of the digital audio signal, where the audio samples in this embodiment are transmitted in units of data pages, and Step 912 may perform processing on the audio samples within a data page that has been received. The adaptive gain value A_Gain mentioned above is adjustable, and the volume of the digital audio signal can be dynamically adjusted in accordance with the adaptive gain value A_Gain so as to be properly controlled. According to this embodiment, the adaptive gain value A_Gain has an initial value, and the initial value is equal to one, so the first data page carried by the digital audio signal is bypassed in Step 912. That is, the first data page in this embodiment is directly outputted, where the volume thereof is substantially unadjusted. According to a variation of this embodiment, the initial value is less than one, so as to generate a fade-in effect.

In Step 914, the processed data page is output. As mentioned above, the audio samples in this embodiment are transmitted in units of data pages, and the data page outputted by Step 914 is carried by a digital output signal corresponding to the digital audio signal. Thus, the digital output signal carries the volume-adjusted audio samples.

In Step 916, it is detected whether data carried by the digital audio signal (e.g. the audio samples) satisfies a specific criterion. More specifically, according to this embodiment, Step 916 substantially detects whether the next data page is a burst data page regarding the audio samples of the next data page. As the data page corresponds to a specific time interval, Step 916 substantially detects whether the ratio of a first data amount to a second data amount reaches a predetermined ratio, where the second data amount is the amount of data carried by the digital audio signal during the specific time interval, and the first data amount is the amount of data whose volume exceeds a predetermined threshold during the specific time interval. In this embodiment, the predetermined threshold is equal to −6 dB, and the predetermined ratio is equal to 1/4.

The audio signal processing method 910 utilizes a pendulum counter to count the number of times the data carried by the digital audio signal satisfies the specific criterion mentioned above. If the data carried by the digital audio signal satisfies the specific criterion, the audio signal processing method 910 increases the counter value of the pendulum counter. Conversely, if the data carried by the digital audio signal does not satisfy the specific criterion, the audio signal processing method 910 decreases the counter value of the pendulum counter. Thus, according to this embodiment, if the data page is determined to be a burst data page in Step 916, Step 920 is executed to increase the counter value of the pendulum counter and then Step 922 is entered; otherwise, Step 930 is executed to decrease the counter value of the pendulum counter and then Step 932 is entered.

In Step 922, it is determined whether the counter value of the pendulum counter reaches an upper bond UB. If the counter value of the pendulum counter reaches the upper bond UB, Step 924 is executed to determine whether the current mode is a stress mode; otherwise, Step 912 is executed.

In Step 924, if the current mode is not the stress mode, Step 926 is entered to decrease the adaptive gain value A_Gain according to a decrement, in order to decrease the volume of the digital audio signal. In this embodiment, a weighted gain value W_Gain, which is adjustable, can be utilized for representing a target value of the adaptive gain value A_Gain, so as to provide flexibility of selecting whether to adjust the adaptive gain value A_Gain or not before actually adjusting the adaptive gain value A_Gain. In addition, the decrement mentioned above is implemented by utilizing a first gain adjustment amount In_Vector corresponding to the decrement. As a result, the audio signal processing method 910 first increases the weighted gain value W_Gain according to the first gain adjustment amount In_Vector in Step 926, and then sets the adaptive gain value A_Gain as the weighted gain value W_Gain in Step 928.

Similarly, in Step 932, it is determined whether the counter value of the pendulum counter reaches a lower bond LB, where the lower bond LB and the upper bond UB of this embodiment can be different from each other, so as to satisfy the need of providing different determining rules respectively for the situation where increasing the volume is required and the situation where decreasing the volume is required. If the counter value of the pendulum counter reaches the lower bond LB, Step 934 is executed to determine whether the current mode is the stress mode; otherwise, Step 912 is executed.

In Step 934, if the current mode is not the stress mode, Step 936 is entered to increase the adaptive gain value A_Gain according to an increment to increase the volume of the digital audio signal. According to this embodiment, the magnitude of the decrement and the magnitude of the increment are different from each other, so as to satisfy the need for different speeds for respectively increasing the volume and decreasing the volume. According to an implementation choice, the magnitude of the decrement is greater than the magnitude of the increment. In addition, the increment mentioned above is implemented by utilizing a second gain adjustment amount De_Vector corresponding to the increment, where the magnitude of the second gain adjustment amount De_Vector and the magnitude of the first gain adjustment amount In_Vector are different from each other in this embodiment. As a result, the audio signal processing method 910 first decreases the weighted gain value W_Gain according to the second gain adjustment amount De_Vector in Step 936, and then checks whether the weighted gain value W_Gain is less than zero in Step 938. If the checked result of Step 938 indicates that the weighted gain value W_Gain is less than zero, Step 940 is executed to reset the weighted gain value W_Gain to zero and then Step 912 is executed; otherwise, Step 928 is executed to set the adaptive gain value A_Gain as the weighted gain value W_Gain.

According to this embodiment, a stress gain value S_Gain, which is adjustable, can be utilized for representing a target value of the adaptive gain value A_Gain. Operations related to the stress mode mentioned in Step 924 and Step 934 and related to the stress gain value S_Gain are described as follows.

In Step 948, it is determined whether the adaptive gain value A_Gain reaches a normal limit value N_Limit. If the adaptive gain value A_Gain reaches the normal limit value N_Limit, Step 950 is executed to increase the counter value of a stress counter according to a first count adjustment amount Str_Vector; otherwise, Step 912 is executed. According to this embodiment, Step 950 will further set the weighted gain value W_Gain as a locked value, so that in a situation where a series of burst data pages occur that would probably lead to entering the stress mode, increasing the weighted gain value W_Gain too fast before entering the stress mode can be prevented.

In Step 952, it is determined whether the counter value of the stress counter reaches a stress threshold value. If the counter value of the stress counter reaches the stress threshold value, Step 954 is executed to set the current mode as the stress mode mentioned above; otherwise, Step 912 is executed. If the current mode is the stress mode, once Step 924 is entered, Step 944 is then executed to increase the stress gain value S_Gain and set the adaptive gain value A_Gain as the stress gain value S_Gain.

Similarly, if the current mode is the stress mode, once Step 934 is entered, Step 960 is then executed to decrease the counter value of the stress counter according to a second count adjustment amount DeStr_Vector. In Step 962, it is determined whether the counter value of the stress counter reaches zero. If the counter value of the stress counter reaches zero, Step 964 is executed to reset the current mode to escape the stress mode, and then Step 912 is executed; otherwise, Step 912 is directly executed.

It is noted that the magnitude of the second count adjustment amount DeStr_Vector and the magnitude of the first count adjustment amount Str_Vector are different from each other in this embodiment. This means the difficulty degree of entering the stress mode can be different from the difficulty degree of escaping the stress mode. By utilizing such kinds of differential design schemes (e.g. the different difficulty degrees as mentioned), different requirements for opposite operational directions can be satisfied according to this embodiment. According to an implementation choice of this embodiment, the magnitude of the second count adjustment amount DeStr_Vector is less than the magnitude of the first count adjustment amount Str_Vector, so that the difficulty degree of escaping the stress mode is higher than the difficulty degree of entering the stress mode. Thus, in a situation where a series of burst data pages is encountered, the audio signal processing method of this embodiment is capable of rapidly entering the stress mode, so the volume can be properly controlled to prevent the speaker from being burned out. On the other hand, when the number of burst data pages within the data pages transmitted subsequently decreases, gradually escaping the stress mode according to this embodiment may make volume variations more natural, and even unobservable.

Figure 3:
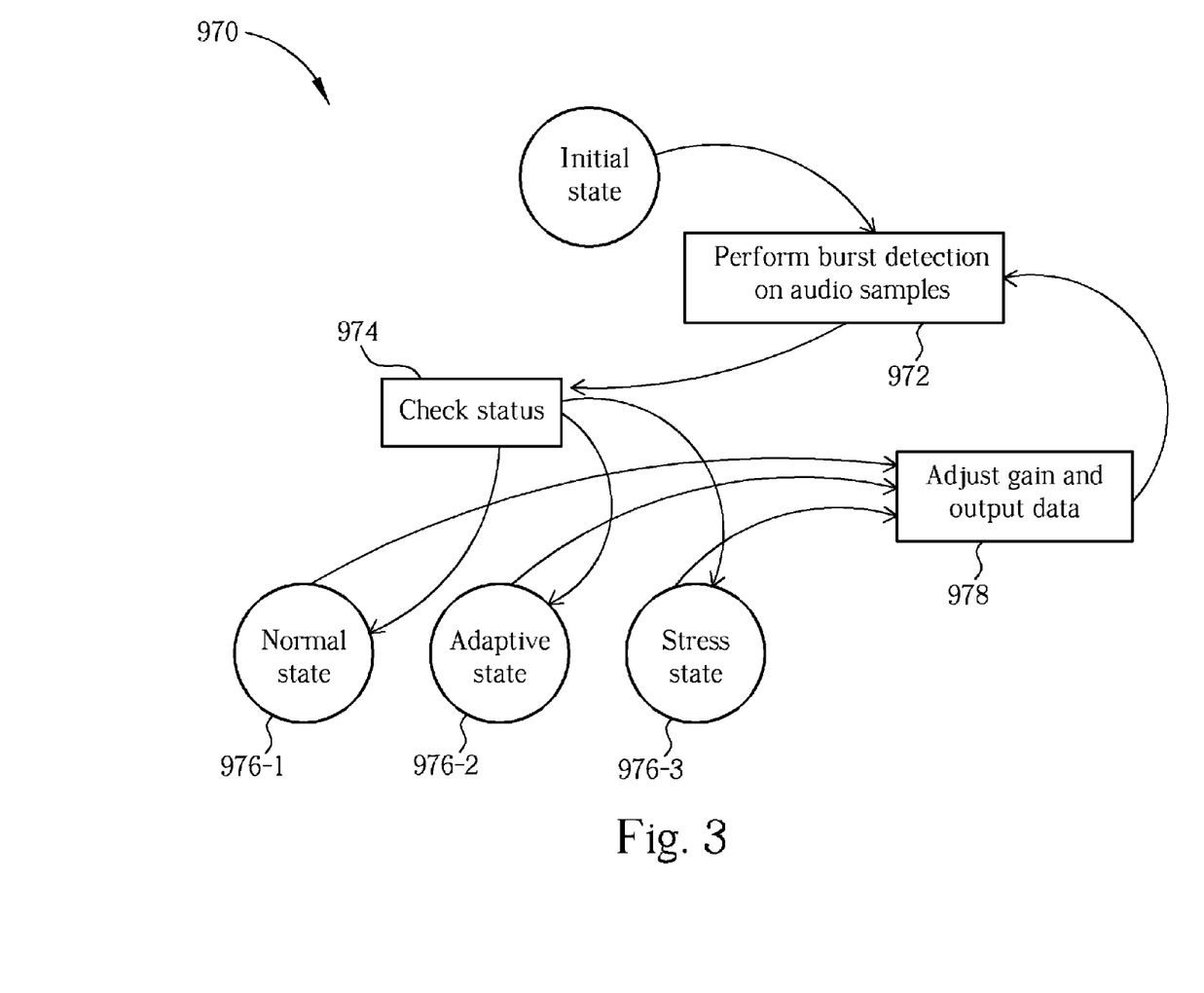
FIG. 3 illustrates a plurality of states checked by an audio signal processing method according to another embodiment of the present invention.

Please refer to FIG. 3. FIG. 3 illustrates a plurality of states 976-1, 976-2, and 976-3 checked by an audio signal processing method 970 according to a second embodiment of the present invention, where this embodiment is a variation of the first embodiment. As shown in FIG. 3, the audio signal processing method 970 performs burst detection on a plurality of audio samples (e.g. the volume-adjusted audio samples) in Step 972, and then checks status in Step 974, so as to enter one of the states 976-1, 976-2, and 976-3. In this embodiment, the state 976-1 represents a normal state, in which the adaptive gain value A_Gain is equal to one. In addition, the state 976-2 of this embodiment represents an adaptive state, and corresponds to the process where the adaptive gain value A_Gain is set as the weighted gain value W_Gain as mentioned in the first embodiment. According to this embodiment, the adaptive gain value A_Gain in this state (976-2) is less than one, and decreases step by step in accordance with the number of times of successively entering the state 976-2 till reaching the locked value mentioned above. Additionally, the state 976-3 of this embodiment represents a stress state, and corresponds to the stress mode as mentioned in the first embodiment. According to this embodiment, the adaptive gain value A_Gain in the state 976-3 is minimal, in contrast to one of the other two states 976-1 and 976-2.

In Step 978, the gain and output data are adjusted. According to this embodiment, the adaptive gain value A_Gain will be set to correspond to the state entered while executing Step 972 this time (or this iteration), so as to automatically optimize the adaptive gain value A_Gain and control the volume of the digital audio signal according to the adaptive gain value A_Gain, where the volume-adjusted audio samples are outputted through the digital output signal mentioned above. After executing Step 978, Step 972 is then re-entered to perform the burst detection on a plurality of audio samples within the next data page. Similar descriptions such as those in the first embodiment are not repeated here.

Figure 4:
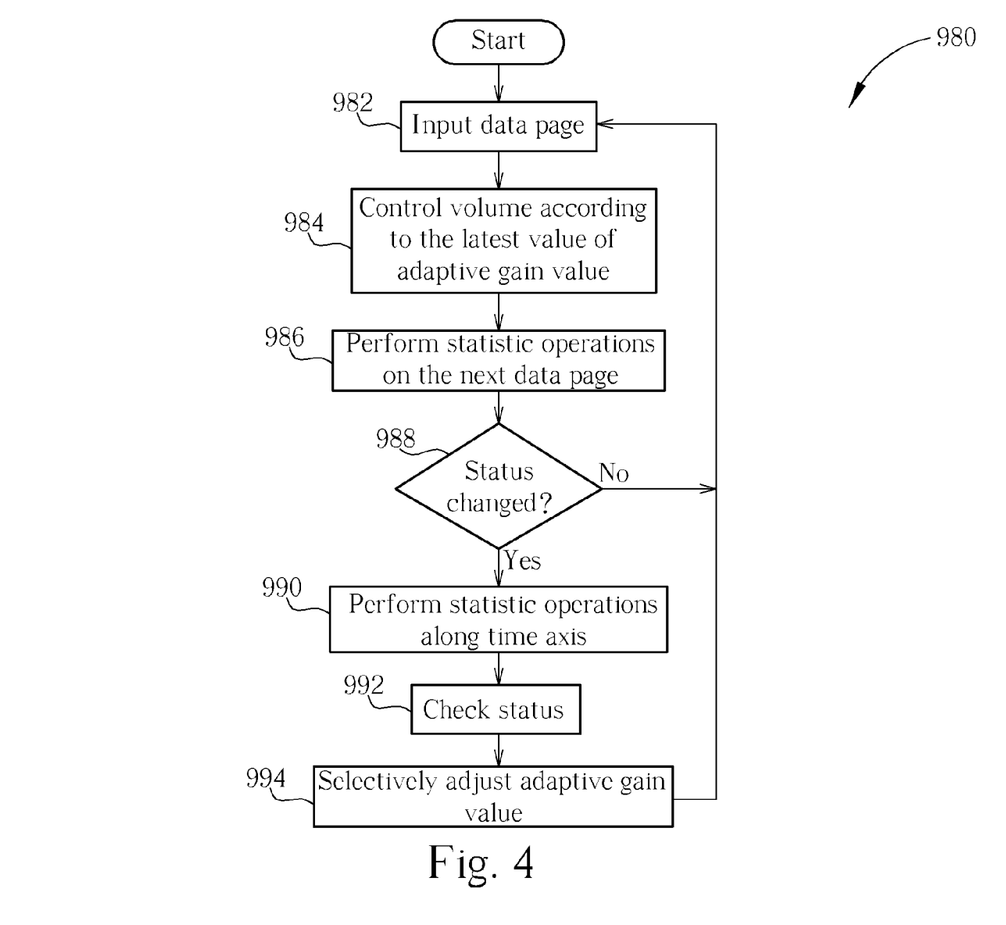
FIG. 4 is a flowchart of an audio signal processing method according to another embodiment of the present invention.

Please refer to FIG. 4. FIG. 4 is a flowchart of an audio signal processing method 980 according to a third embodiment of the present invention, where this embodiment is also a variation of the first embodiment. The audio signal processing method 980 first inputs a data page in Step 982, and then controls the volume of the digital audio signal according to the latest value of the adaptive gain value A_Gain in Step 984, where the portion of operations correspond to Steps 912 and 914 as mentioned in the first embodiment. Afterwards, the audio signal processing method 980 is capable of performing statistic operations on the next data page in Step 986, for example, performing the corresponding operations as mentioned in Steps 916, 920, 922, 930, and 932. In Step 988, the audio signal processing method 980 checks whether the burst status is changed or not, with the operations thereof corresponding to the status check performed in Step 974 as mentioned in the second embodiment. If the burst status has been changed, Step 990 is executed; otherwise, Step 982 is executed.

Once the burst status has been changed as detected in Step 988, Step 990 is entered to perform statistic operations along the time axis, and then status(es) are checked in Step 992, where the portion of operations can be implemented according to various implementation methods, one of which is performing statistical operations on the counter value of the stress counter mentioned in the first embodiment and performing the corresponding determining steps. If the burst status has been changed, adjusting the adaptive gain value A_Gain may be required. As a result, Step 994 selectively adjusts the adaptive gain value A_Gain, wherein whether to adjust the adaptive gain value A_Gain can be determined according to the check result(s) derived from the status check performed in Step 992. Similar descriptions such as those in the embodiments mentioned above are not repeated here.

Figure 5:
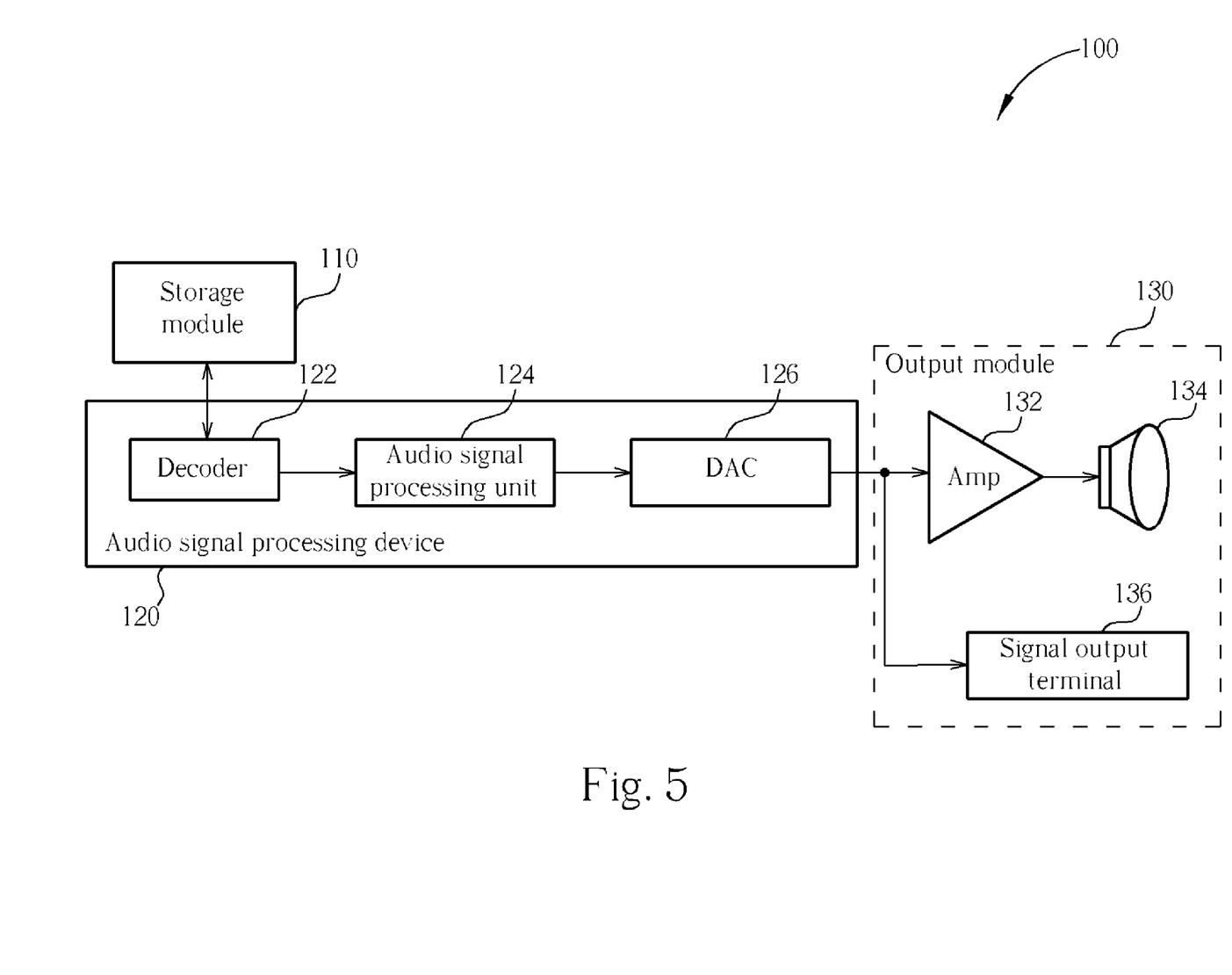
FIG. 5 is a diagram of an audio playback device according to one embodiment of the present invention.

FIG. 5 is a diagram of an audio playback device 100 according to one embodiment of the present invention. The audio playback device 100 comprises a storage module 110, an audio signal processing device 120, and an output module 130, where the audio signal processing device 120 comprises a decoder 122, an audio signal processing unit 124, and a DAC 126, and the output module 130 comprises an amplifier 132, a speaker 134, and at least one signal output terminal 136. The audio signal processing methods 910, 970, and 980 in the embodiments mentioned above are applicable to the audio playback device 100 of this embodiment, and more particularly, are applicable to the audio signal processing unit 124 in the audio signal processing device 120.

The storage module 110 is utilized for storing audio information and outputting a bit stream corresponding to the audio information while the audio information is read. In addition, the decoder 122 is utilized for decoding the bit stream to generate the digital audio signal mentioned above, and the audio signal processing unit 124 is utilized for controlling the volume of the digital audio signal according to at least one audio signal processing method of the present invention, such as at least one of the audio signal processing methods 910, 970, and 980 mentioned above, to generate the digital output signal corresponding to the digital audio signal, where the digital output signal carries the volume-adjusted audio samples. Additionally, the DAC 126 is utilized for performing digital-to-analog conversion on the digital output signal to generate an analog output signal, and the output module 130 is utilized for outputting the analog output signal representing the audio information.

According to this embodiment, the amplifier 132 can be utilized for amplifying the analog output signal to generate an amplified signal corresponding to the analog output signal, where the amplified signal can be utilized for driving the speaker 134. In addition, the speaker 134 of this embodiment represents the speaker mentioned in the first embodiment, for playing back the amplified signal. Additionally, the signal output terminal 136 can be utilized for outputting the analog output signal, for example, outputting the analog output signal to an earphone.

According to a variation of this embodiment, it is not necessary to install the amplifier 132 within the output module 130 as mentioned above, where the speaker 134 is electrically connected to the DAC 126 to receive the analog output signal, and can be utilized for playing back the analog output signal.

It is an advantage of the present invention that the audio signal processing methods and related devices of the present invention do not need to perform function operations on each audio samples in contrast to the prior art. Therefore, the present invention may realize the optimization control of controlling the volume of the digital audio signal while the calculation loading is greatly reduced.

It is another advantage of the present invention that the audio signal processing methods and related devices of the present invention perform processing in units of data sets consisting of a plurality of audio samples, for example, frames or data pages, so the present invention may greatly reduce or completely eliminate the problems such as the sample related distortions mentioned above.

It is another advantage of the present invention that the audio signal processing methods and related devices of the present invention can be easily combined with some other audio processing function(s). For example, the audio signal processing unit mentioned above can be easily combined with IIR filters, without introducing problems such as difficulty in maintenance while combining the conventional volume control circuit with the other audio processing functions in the prior art.

It is yet another advantage of the present invention that the audio signal processing methods and related devices of the present invention may perform fine tuning on related parameters (e.g. the upper bond UB, the lower bond LB, the first gain adjustment amount In_Vector, the second gain adjustment amount De_Vector, the normal limit value N_Limit, . . . , etc. during a hardware design phase. Thus, the present invention can improve the research efficiency and reduce the time required for launching the product to the market.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An audio signal processing method, comprising:
    controlling the volume of a digital audio signal according to a latest value of an adaptive gain value which is adjustable;
    detecting whether data carried by the digital audio signal satisfies a specific criterion and utilizing a pendulum counter to count a number of times the data carried by the digital audio signal satisfies the specific criterion;
    if the counter value of the pendulum counter reaches an upper bond, selectively decreasing the adaptive gain value according to a decrement to decrease the volume of the digital audio signal; and
    if the counter value of the pendulum counter reaches a lower bond, selectively increasing the adaptive gain value according to an increment to increase the volume of the digital audio signal, wherein the magnitude of the decrement and the magnitude of the increment are different from each other;
    wherein the step of detecting whether the data carried by the digital audio signal satisfies the specific criterion further comprises:
    detecting whether the ratio of a first data amount to a second data amount reaches a predetermined ratio, wherein the second data amount is an amount of data carried by the digital audio signal during a specific time interval, and the first data amount is an amount of data whose volume exceeds a predetermined threshold during the specific time interval.

2. The audio signal processing method of claim 1, wherein the step of utilizing the pendulum counter to count a number of times the data carried by the digital audio signal satisfies the specific criterion further comprises:
    utilizing the pendulum counter to count a number of times the ratio of the first data amount to the second data amount reaches the predetermined ratio.

3. The audio signal processing method of claim 2, wherein the step of utilizing the pendulum counter to count a number of times the ratio of the first data amount to the second data amount reaches the predetermined ratio further comprises:
    if the ratio of the first data amount to the second data amount reaches the predetermined ratio, increasing the counter value of the pendulum counter; and/or
    if the ratio of the first data amount to the second data amount has not reached the predetermined ratio, decreasing the counter value of the pendulum counter.

4. The audio signal processing method of claim 1, wherein the step of selectively decreasing the adaptive gain value according to the decrement further comprises:
    if the counter value of the pendulum counter reaches the upper bond and a current mode is not a stress mode, decreasing the adaptive gain value according to the decrement;
    wherein the step of selectively increasing the adaptive gain value according to the increment further comprises:
    if the counter value of the pendulum counter reaches the lower bond and the current mode is not the stress mode, increasing the adaptive gain value according to the increment.

5. The audio signal processing method of claim 4, wherein a stress gain value is adjustable and utilized for representing a target value of the adaptive gain value, and the audio signal processing method further comprises:
    if the adaptive gain value reaches a normal limit value, increasing the counter value of a stress counter, and if the counter value of the stress counter reaches a stress threshold value, setting the current mode as the stress mode;

if the counter value of the pendulum counter reaches the upper bond and the current mode is the stress mode, increasing the stress gain value and setting the adaptive gain value as the stress gain value; and if the counter value of the pendulum counter reaches the lower bond and the current mode is the stress mode, decreasing the counter value of the stress counter, and if the counter value of the stress counter reaches zero, resetting the current mode to escape the stress mode.

6. The audio signal processing method of claim 5, wherein the step of increasing the counter value of the stress counter further comprises increasing the counter value of the stress counter according to a first count adjustment amount, and the step of decreasing the counter value of the stress counter further comprises decreasing the counter value of the stress counter according to a second count adjustment amount, and the magnitude of the first count adjustment amount and the magnitude of the second count adjustment amount are different from each other.

7. The audio signal processing method of claim 6, wherein the magnitude of the first count adjustment amount is greater than the magnitude of the second count adjustment amount.

8. The audio signal processing method of claim 1, wherein the magnitude of the decrement is greater than the magnitude of the increment.

9. The audio signal processing method of claim 1, wherein a weighted gain value is adjustable and utilized for representing a target value of the adaptive gain value, the step of selectively decreasing the adaptive gain value according to the decrement further comprises selectively adjusting the weighted gain value according to a first gain adjustment amount corresponding to the decrement and setting the adaptive gain value as the weighted gain value, and the step of selectively increasing the adaptive gain value according to the increment further comprises:

selectively adjusting the weighted gain value according to a second gain adjustment amount corresponding to the increment; and if the weighted gain value is less than zero, resetting the weighted gain value to zero, otherwise, setting the adaptive gain value as the weighted gain value.

10. An audio signal processing device, comprising:

a decoder for decoding a bit stream to generate a digital audio signal; and an audio signal processing unit, coupled to the decoder, for controlling the volume of the digital audio signal according to an audio signal processing method;

wherein the audio signal processing method comprises:

controlling the volume of the digital audio signal according to a latest value of an adaptive gain value which is adjustable;

detecting whether data carried by the digital audio signal satisfies a specific criterion and utilizing a pendulum counter to count a number of times the data carried by the digital audio signal satisfies the specific criterion;

if the counter value of the pendulum counter reaches an upper bond, selectively decreasing the adaptive gain value according to a decrement to decrease the volume of the digital audio signal; and if the counter value of the pendulum counter reaches a lower bond, selectively increasing the adaptive gain value according to an increment to increase the volume of the digital audio signal, wherein the magnitude of the decrement and the magnitude of the increment are different from each other;

wherein the step of detecting whether the data carried by the digital audio signal satisfies the specific criterion further comprises:

detecting whether the ratio of a first data amount to a second data amount reaches a predetermined ratio, wherein the second data amount is an amount of data carried by the digital audio signal during a specific time interval, and the first data amount is an amount of data whose volume exceeds a predetermined threshold during the specific time interval.

11. The audio signal processing device of claim 10, wherein the audio signal processing unit controls the volume of the digital audio signal to generate a digital output signal corresponding to the digital audio signal, and the audio signal processing device further comprises:

a digital-to-analog converter (DAC), coupled to the audio signal processing unit, for performing digital-to-analog conversion on the digital output signal to generate an analog output signal.

12. The audio signal processing device of claim 10, wherein the step of selectively decreasing the adaptive gain value according to the decrement further comprises:

if the counter value of the pendulum counter reaches the upper bond and a current mode is not a stress mode, decreasing the adaptive gain value according to the decrement;

wherein the step of selectively increasing the adaptive gain value according to the increment further comprises:

if the counter value of the pendulum counter reaches the lower bond and the current mode is not the stress mode, increasing the adaptive gain value according to the increment.

13. The audio signal processing device of claim 12, wherein a stress gain value is adjustable and utilized for representing a target value of the adaptive gain value, and the audio signal processing method further comprises:

if the adaptive gain value reaches a normal limit value, increasing the counter value of a stress counter, and if the counter value of the stress counter reaches a stress threshold value, setting the current mode as the stress mode;

if the counter value of the pendulum counter reaches the upper bond and the current mode is the stress mode, increasing the stress gain value and setting the adaptive gain value as the stress gain value; and if the counter value of the pendulum counter reaches the lower bond and the current mode is the stress mode, decreasing the counter value of the stress counter, and if the counter value of the stress counter reaches zero, resetting the current mode to escape the stress mode.

14. The audio signal processing device of claim 10, wherein a weighted gain value is adjustable and utilized for representing a target value of the adaptive gain value, the step of selectively decreasing the adaptive gain value according to the decrement further comprises selectively adjusting the weighted gain value according to a first gain adjustment amount corresponding to the decrement and setting the adaptive gain value as the weighted gain value, and the step of selectively increasing the adaptive gain value according to the increment further comprises:

selectively adjusting the weighted gain value according to a second gain adjustment amount corresponding to the increment; and if the weighted gain value is less than zero, resetting the weighted gain value to zero, otherwise, setting the adaptive gain value as the weighted gain value.

15. An audio playback device, comprising:
a storage module for storing audio information, and outputting a bit stream corresponding to the audio information while the audio information is read;
a decoder, coupled to the storage module, for decoding the bit stream to generate a digital audio signal;
an audio signal processing unit, coupled to the decoder, for controlling the volume of the digital audio signal according to an audio signal processing method to generate a digital output signal corresponding to the digital audio signal;
a digital-to-analog converter (DAC), coupled to the audio signal processing unit, for performing digital-to-analog conversion on the digital output signal to generate an analog output signal; and
an output module for outputting the analog output signal representing the audio information;
wherein the audio signal processing method comprises:
  controlling the volume of the digital audio signal according to a latest value of an adaptive gain value which is adjustable;
  detecting whether data carried by the digital audio signal satisfies a specific criterion and utilizing a pendulum counter to count a number of times the data carried by the digital audio signal satisfies the specific criterion;
  if the counter value of the pendulum counter reaches an upper bond, selectively decreasing the adaptive gain value according to a decrement to decrease the volume of the digital audio signal; and
  if the counter value of the pendulum counter reaches a lower bond, selectively increasing the adaptive gain value according to an increment to increase the volume of the digital audio signal, wherein the magnitude of the decrement and the magnitude of the increment are different from each other;
wherein the step of detecting whether the data carried by the digital audio signal satisfies the specific criterion further comprises:
detecting whether the ratio of a first data amount to a second data amount reaches a predetermined ratio, wherein the second data amount is an amount of data carried by the digital audio signal during a specific time interval, and the first data amount is an amount of data whose volume exceeds a predetermined threshold during the specific time interval.

16. The audio playback device of claim 15, wherein the output module comprises an amplifier for amplifying the analog output signal.

17. The audio playback device of claim 15, wherein the output module comprises a speaker for playing back the analog output signal or an amplified signal corresponding to the analog output signal.

18. The audio playback device of claim 15, wherein the output module comprises at least one signal output terminal for outputting the analog output signal.

* * * * *